United States Patent
Kroeger

(10) Patent No.: US 7,512,175 B2
(45) Date of Patent: Mar. 31, 2009

(54) METHOD FOR SYNCHRONIZING EXPORTER AND EXCITER CLOCKS

(75) Inventor: Brian William Kroeger, Sykesville, MD (US)

(73) Assignee: iBiquity Digital Corporation, Columbia, MD (US)

( * ) Notice: Subject to any disclaimer, the term of this patent is extended or adjusted under 35 U.S.C. 154(b) by 702 days.

(21) Appl. No.: 11/081,267

(22) Filed: Mar. 16, 2005

(65) Prior Publication Data

US 2006/0209941 A1  Sep. 21, 2006

(51) Int. Cl.
H04B 1/38 (2006.01)

(52) U.S. Cl. ...................................... 375/222

(58) Field of Classification Search ................ 375/222, 375/354, 357, 369, 372, 373, 374; 370/395.62, 370/507; 455/265; 702/89; 713/375, 400
See application file for complete search history.

(56) References Cited

U.S. PATENT DOCUMENTS

| | | | |
|---|---|---|---|
| 4,959,718 A * | 9/1990 | Bennett | 348/536 |
| 5,903,574 A | 5/1999 | Lyons | |
| 6,055,021 A | 4/2000 | Twitchell | |
| 6,549,544 B1 | 4/2003 | Kroeger et al. | |
| 6,556,639 B1 | 4/2003 | Goldston et al. | |
| 6,680,977 B2 | 1/2004 | Collins et al. | |
| 6,721,337 B1 | 4/2004 | Kroeger et al. | |
| 6,735,257 B2 | 5/2004 | Kroeger | |
| 7,301,995 B2 * | 11/2007 | Scott et al. | 375/220 |
| 2003/0086442 A1 | 5/2003 | Reynolds et al. | |
| 2004/0041948 A1 | 3/2004 | Collins et al. | |

FOREIGN PATENT DOCUMENTS

| | | |
|---|---|---|
| EP | 1041758 A2 | 10/2000 |
| EP | 1471745 A1 | 10/2004 |

* cited by examiner

*Primary Examiner*—Sam K Ahn
(74) *Attorney, Agent, or Firm*—Robert P. Lenart, Esq.; Pietragallo Gordon Alfano Bosick & Raspanti, LLP

(57) ABSTRACT

A method for synchronizing an exciter clock with a modem frame clock in a broadcasting system comprises the steps of receiving a plurality of modem frame pulses that are representative of the start of modem frames of audio signals and data signals, wherein timing of the modem frame pulses is controlled by a modem frame clock, producing an exciter clock signal, counting pulses representative of the exciter clock signal to produce a count representative of timing error of each incoming modem frame pulse, and controlling the exciter clock signal in response to the count. An apparatus that performs the method is also provided.

15 Claims, 7 Drawing Sheets

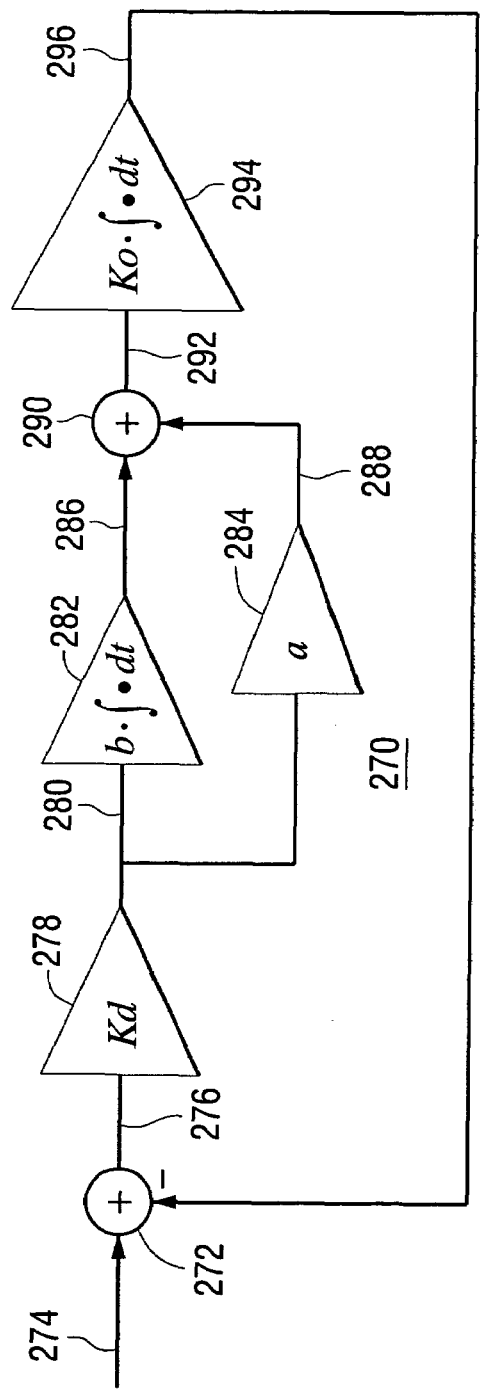
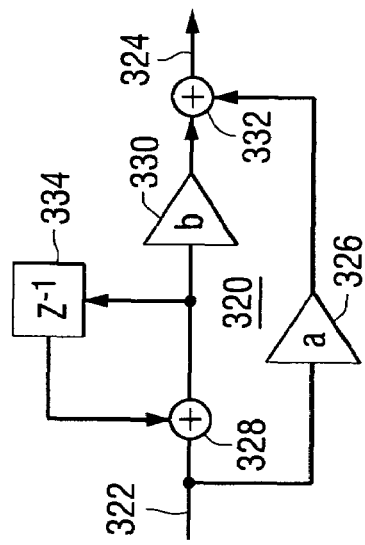
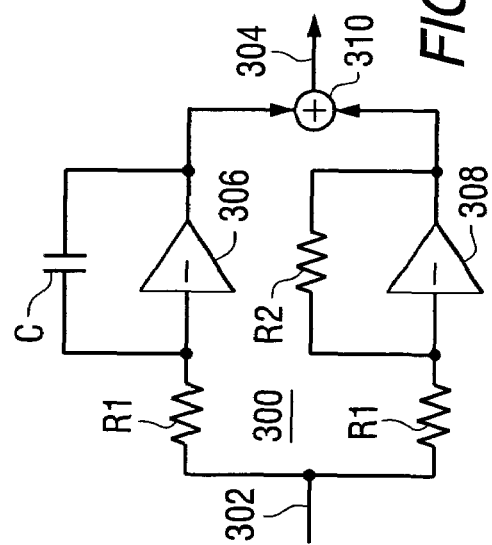
*FIG. 6*
*FIG. 7a*
*FIG. 7b*

METHOD FOR SYNCHRONIZING EXPORTER AND EXCITER CLOCKS

FIELD OF THE INVENTION

This invention relates to radio broadcasting systems, and more particularly to methods and apparatus for synchronizing clocks in studios and transmitters.

BACKGROUND OF THE INVENTION

The iBiquity Digital Corporation HD Radio™ system is designed to permit a smooth evolution from current analog Amplitude Modulation (AM) and Frequency Modulation (FM) radio to a fully digital In-Band On-Channel (IBOC) system. This system delivers digital audio and data services to mobile, portable, and fixed receivers from terrestrial transmitters in the existing Medium Frequency (MF) and Very High Frequency (VHF) radio bands. Broadcasters may continue to transmit analog AM and FM simultaneously with the new, higher-quality and more robust digital signals, allowing themselves and their listeners to convert from analog to digital radio while maintaining their current frequency allocations.

Two major components in the broadcast system architecture are the exporter and the exciter. Normally, the exporter is resident at a radio station's studio and the exciter is located at the transmission site, although nothing prohibits them from being collocated at the transmission site. The interface between the exporter and exciter is unidirectional (usually over a digital Studio Transmitter Link (STL)) typically using an Ethernet for the exciter link.

The digital audio and data signals can include a plurality of services including a Main Program Service (MPS) and a Station Information Service (SIS). The exporter contains the software and hardware required for the MPS and the SIS. It accepts analog and digital audio over an audio interface, compresses the audio and outputs the compressed audio to the exciter over the unidirectional exciter link.

An HD Codec (HDC) can be located in the studio in the exporter. The exporter outputs a signal for the STL path that contains both the HDC coded audio and all data services. The analog audio signal is delayed in the exporter for diversity delay, and output at 44.1 kHz. It may then be sent on an existing STL or resampled at 32 kHz and sent with the HDC stream on a multiplexed STL that can fit within the 300 kHz STL allocation. The RF modulation portion is at the transmitter site. This allows for a bandwidth-efficient bitstream.

The exciter contains an exciter engine (exgine) subsystem and the necessary hardware required to produce the HD Radio™ waveform. All interfacing between the exporter and exgine occurs over the unidirectional exciter link. The exciter link messages that are transmitted across the link contain the logical channel data to be modulated by the exgine as well as appropriate command and control needed between the exporter and exgine.

The coded audio and data are combined on a single transport stream, with the audio coding and data manipulation being performed in the studio. Everything passed over the exciter link is message based. Each message has a header and a body. The header includes at least an identifier, a body, a sequence number and a cyclic redundancy check. The bodies of the messages have a specific format. For the unidirectional exciter link, the body is always a command message, since there is no back channel to carry a response.

An element of the exgine system is the importer. The importer is implemented in software, and manages all of the data, including third party data, program associated data (PAD) or supplemental channels, for example. It multiplexes the data, plus the encoded HDC information from the digital IBOC signal, and feeds that information as one bitstream to the exciter.

In certain HD Radio™ systems, the HDC FM System is capable of a 20 kHz response, while the HDC AM System provides a 15 kHz response. For a 20 kHz audio response for HDC FM, the STL system must employ a sampling rate of 44.1 kHz or higher in order to pass the upper spectra. Since the HDC system requires a 44.1 kHz master clock, there is a subtle advantage to using a digital STL system that operates at 44.1 kHz, as it will eliminate a sample-rate-converter (SRC). However, STL systems employing either 32 kHz or 48 kHz sampling can also be used.

The HDC system employs a master clock to sync everything to the 44.1 kHz sampling rate. Processing can utilize two configurations: two separate units (one for HDC and one for conventional transmission), or a single dual output combination processor that provides dedicated processed audio for both channels.

Consider first the effects of clock error on the time synchronization between the exporter and the exgine. If the clocks in these devices have an error difference of 1 ppm, then one clock will slip every millionth clock time. Another way to characterize this is that the time error is one millionth of the total time lapse. For example, an error of 1 ppm drifts 3.6 msec/hr, or 86.4 msec/day, which is equivalent to 159 clocks, or 3810 clocks of the 44.1 kHz audio clock over an hour, or a day, respectively. If a 44.1 kHz clock sample tolerance of a single clock sample is required, then the clocks will drift out of spec in only 22.7 seconds at 1 ppm clock error. Thus it is clear that some sort of additional synchronization is needed.

GPS-locked 10 MHz clocks can be used in both the exporter at the studio and the exgine at the transmitter site to maintain synchronization between the two locations when they are connected via STL link. However it may be difficult in some cases to receive the GPS signal at the transmitter location due to high RF noise.

There is a need for an alternative method for generating a synchronous clock at the transmitter site.

SUMMARY OF THE INVENTION

This invention provides a method for synchronizing an exciter clock with a modem frame clock in a broadcasting system. The method comprises the steps of receiving a plurality of modem frame pulses that are representative of the start of modem frames of audio signals and data signals, wherein timing of the modem frame pulses is controlled by a modem frame clock, producing an exciter clock signal, counting pulses representative of the exciter clock signal to produce a count representative of timing error of each incoming modem frame pulse, and controlling the exciter clock signal in response to the count. An apparatus that performs the method is also provided.

In another aspect, the invention provides an apparatus for synchronizing an exciter clock with a modem frame clock in a broadcasting system. The apparatus comprises an input for receiving a plurality of modem frame pulses that are representative of the start of modem frames of audio signals and data signals, wherein timing of the modem frame pulses is controlled by a modem frame clock, a voltage controlled oscillator for producing an exciter clock signal, a counter for counting pulses representative of the exciter clock signal to produce a count representative of timing error of each incoming modem frame pulse, and a loop filter for controlling the exciter clock signal in response to the count.

BRIEF DESCRIPTION OF THE DRAWINGS

FIG. 6 is a diagram of a linear model of the invention.

FIGS. 7a and 7b are diagrams used to illustrate time constants of the models.

DETAILED DESCRIPTION OF THE DRAWINGS

Figure 1:
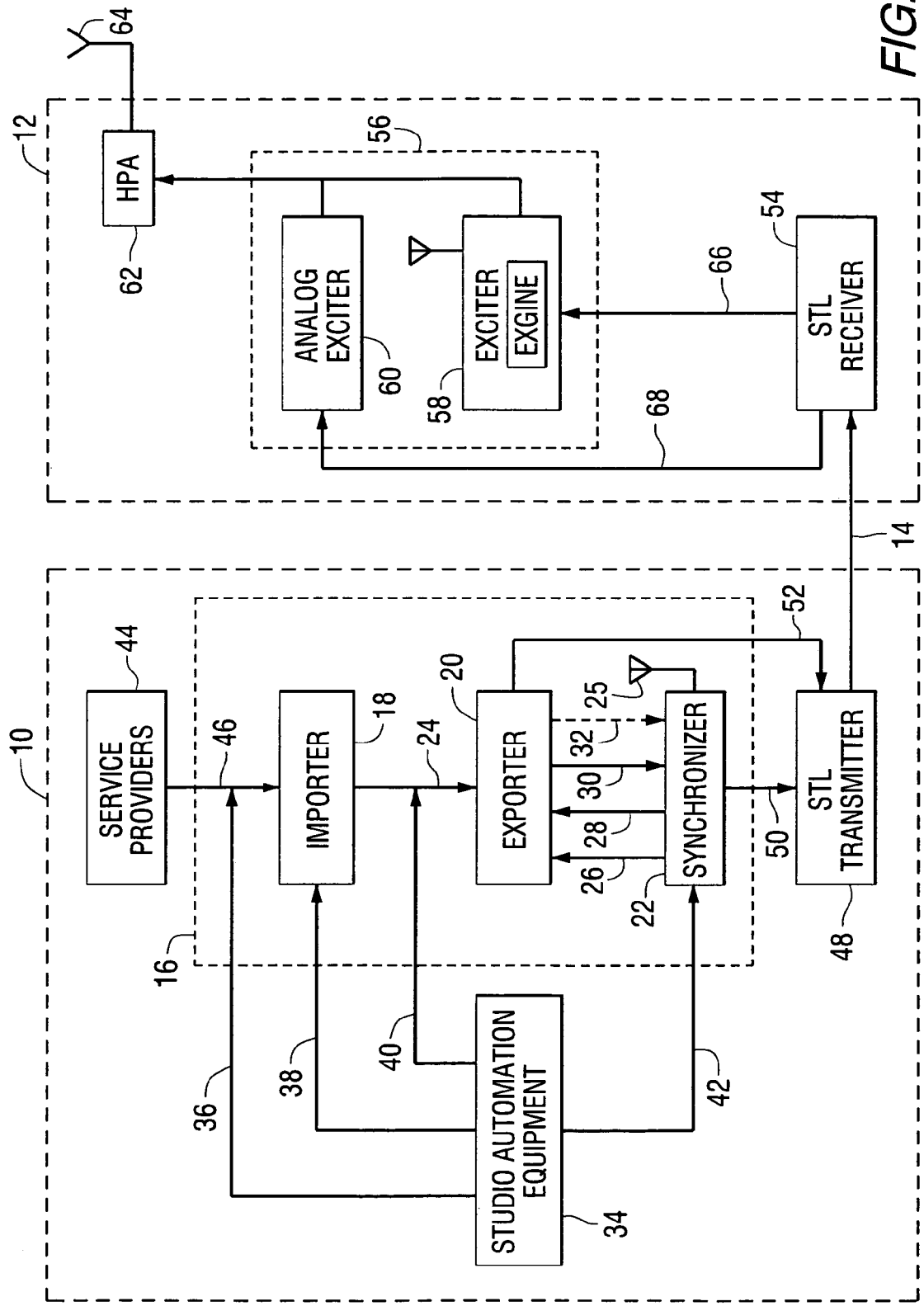
FIG. 1 is a block diagram of a studio, transmitter and studio-to-transmitter link for an FM radio station.

Referring to the drawings, FIG. 1 is a functional block diagram of the relevant components of a studio site 10, a transmitter site 12, and studio-to-transmitter link (STL) 14 that are constructed in accordance with the invention. The studio includes, among other things, an Ensemble Operations Center (EOC) 16 that includes an importer 18, an exporter 20 and a synchronizer 22. The importer and exporter are connected by an exporter data link 24. The synchronizer 22 includes a GPS receiver that is connected to an antenna 25. The exporter and synchronizer exchange a plurality of signals including digital main program service (MPS) audio, analog main program service (MPS) audio, delayed analog main program service (MPS) audio, and bypass control, as illustrated by arrows 26, 28, 30 and 32. The EOC receives a plurality of the audio and data signals from studio audio equipment 34, including a secondary audio data service on line 36, secondary audio service audio on line 38, main program service data on line 40, and main program service audio on line 42. Data service providers 44 supply service data on line 46. A studio transmitter link (STL) transmitter 48 receives delayed analog MPS audio on line 50 and exciter link data on line 52.

The EOC formats the various signals into modem frames, and the STL transmitter sends the modem frames, in the form of framed data, to the transmitter site 12 by way of the STL link 14. The modem frames provide a series of pulses for synchronization at the exciter. A modem frame clock is used to control the signal timing. The transmitter site includes an STL receiver 54, an exciter 56 that includes an exgine subsystem 58 and an analog exciter 60. The transmitter site receives the audio and data signals and processes them for broadcast by a high power amplifier 62 and antenna 64. Exciter link data is provided to the exgine as illustrated by arrow 66. Delayed analog MPS audio is provided to the analog exciter as illustrated by arrow 68. The exciter includes a 10 MHz clock and an up converter.

Figure 2:
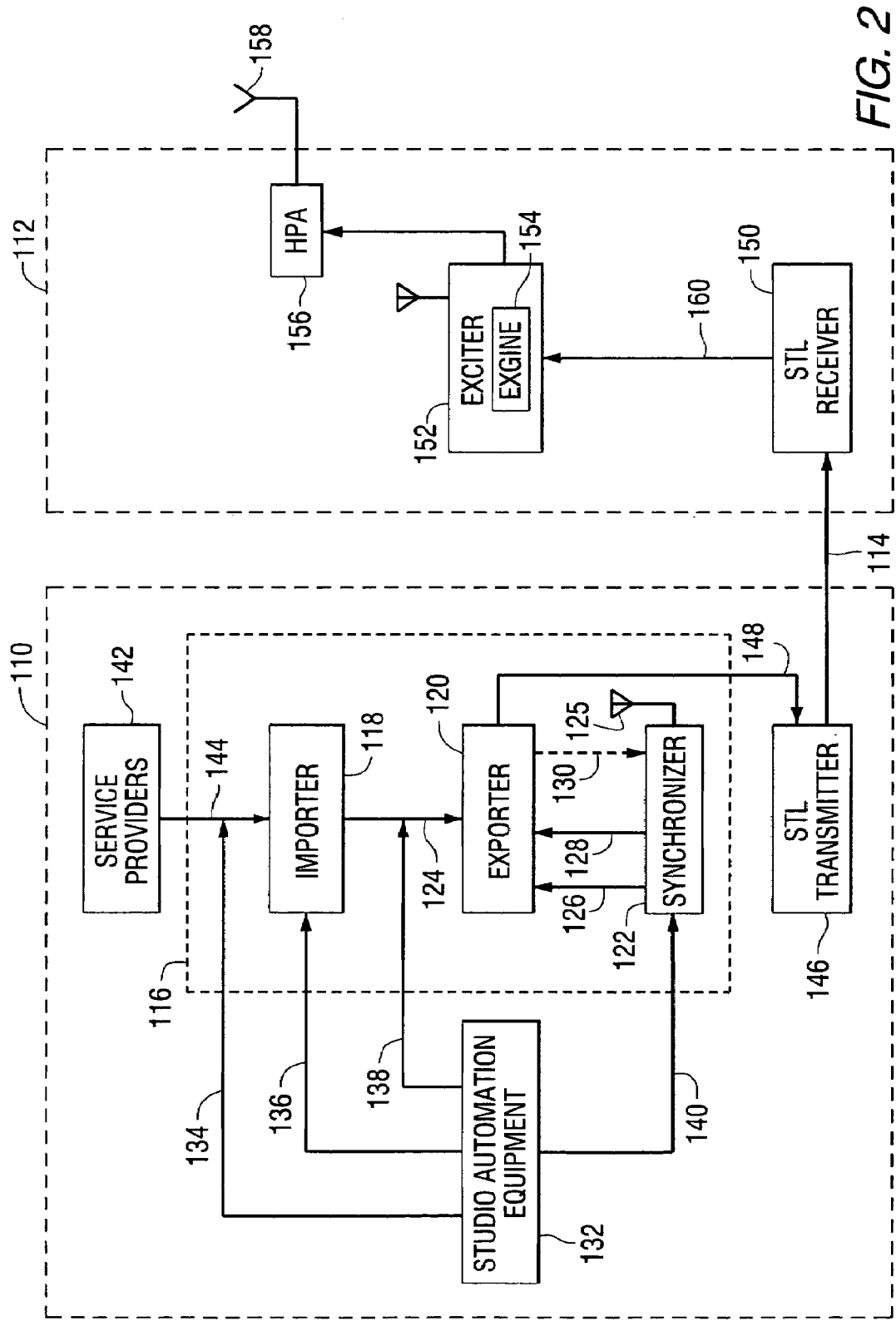
FIG. 2 is a block diagram of a studio, transmitter and studio-to-transmitter link for an AM radio station.

FIG. 2 is a functional block diagram of the relevant components of a studio site 110, a transmitter site 112, and studio-to-transmitter link (STL) 114 that are constructed in accordance with the invention. The studio includes, among other things, an EOC 116 that includes an importer 118, an exporter 120 and a synchronizer 122. The importer and exporter are connected by an exporter data link 124. The synchronizer 122 includes a GPS receiver that is connected to an antenna 125. The exporter and synchronizer exchange a plurality of signals including digital main program service (MPS) audio, analog main program service (MPS) audio, and bypass control, as illustrated by arrows 126, 128 and 130. The EOC receives a plurality of the audio and data signals from studio audio equipment 132, including a secondary audio data service on line 134, secondary audio service audio on line 136, main program service data on line 138, and main program service audio on line 140. Data service providers 142 supply service data on line 144. A studio transmitter link (STL) transmitter 146 receives the signals to be transmitted on exciter link data on line 148.

The EOC formats the various signals into modem frames, and the STL transmitter sends the modem frames in the form of a series of pulses to the transmitter site 112 by way of the STL link 114. A modem frame clock is used to control the signal timing. The transmitter site includes an STL receiver 150 and an exciter 152 that includes an exgine subsystem 154. The transmitter site receives the audio and data signals and processes them for broadcast by a high power amplifier 156 and antenna 158. Exciter link data is provided to the exgine as illustrated by arrow 160. The exciter includes a 10 MHz clock and an up converter.

One solution to the synchronization issue relies on the periodic transmission of a time sync signal over an STL. It is assumed here that the STL clocking is asynchronous with respect to the 10 MHz clock at the transmitter, so the STL clock is an unlikely candidate for use as a reference clock in the exgine. However periodic time sync pulses (nearly) coincident to the modem frame rate can be used to synchronize the exgine clock. Although the time sync signal may be frequency locked to the exporter reference clock over a sufficiently long time span, it has a peak-to-peak time jitter, of for example 1 msec, due to the asynchronous STL clock and software timing. It is also important to consider that this jitter noise is likely not uncorrelated (white) and may have a long periodicity, or beat frequency. If some kind of phase-locked loop (PLL) were used at the exgine to regenerate the 10 MHz clock, then the phase noise and frequency error must remain within specifications during these step errors if signal transmission is enabled. The frequency tolerance, PLL stability, capture range and time constants required of this PLL set the design parameters for implementation. The unusually high frequency multiplication (approximately 15 million) of the modem frame clock to 10 MHz, along with the jitter at the input from the STL, results in an unconventional design with very long time constants.

Another factor to consider is the accuracy, or time jitter, of the synchronization information. Statistical averaging provides a means for estimating a parameter (i.e., modem frame time period) from noisy samples corrupted by jitter (assume a Gaussian uncorrelated distribution for analysis to yield an optimum unbiased estimate). The statistical variance of the estimate average is equal to the variance of each sample divided by the number of samples. Or equivalently, the standard deviation is reduced by the square root of the number of samples in the average. A sort of weighted averaging can be accomplished using PLL techniques.

Figure 3:
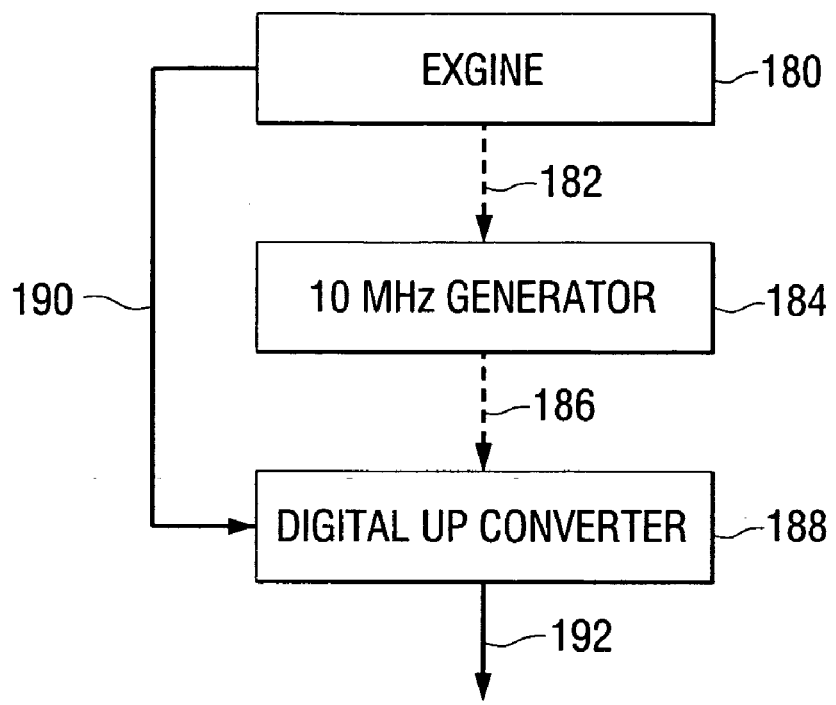
FIG. 3 is a functional diagram of a portion of the exciter at a transmitter site.

FIG. 3 is a functional diagram of a portion of the exciters of FIGs.1 and 2. The exgine subsystem 180 produces a clock signal having a frequency of about 0.673 Hz on line 182. This clock signal is derived from the modem frame timing. The clock signal is provided as a sync message over the STL link from the exporter, and then decoded to create the pulse when the sync message arrives periodically at about 0.673 Hz. The signal serves as an input to a 10 MHz clock generator 184. The 10 Mhz clock generator produces a 10 MHz clock signal on line 186 that is used to control a digital up converter 188. The digital up converter receives the waveform data from the exgine subsystem, as illustrated by arrow 190, and produces the HD Radio ™ signal on line 192.

Figure 4:
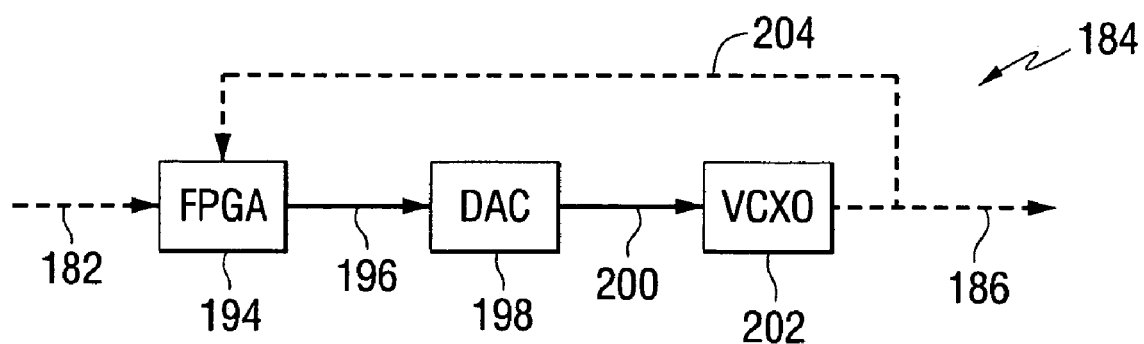
FIG. 4 is a block diagram of a synchronization circuit constructed in accordance with the invention.

FIG. 4 is a block diagram of the 10 MHz clock of FIG. 3. The 0.673 Hz clock signal is input on line 182 to a field programmable gate array (FPGA) 194, for example. The FPGA processes the clock signal to produce a digital control signal on line 196. A digital to analog converter 198 produces an analog voltage signal on line 200. A voltage controlled oscillator (VCXO) 202 produces the 10 MHz clock signal on line 186 in response to the analog control voltage. The 10 MHz clock signal is fed back to the FPGA, as illustrated by arrow 204.

Figure 5:
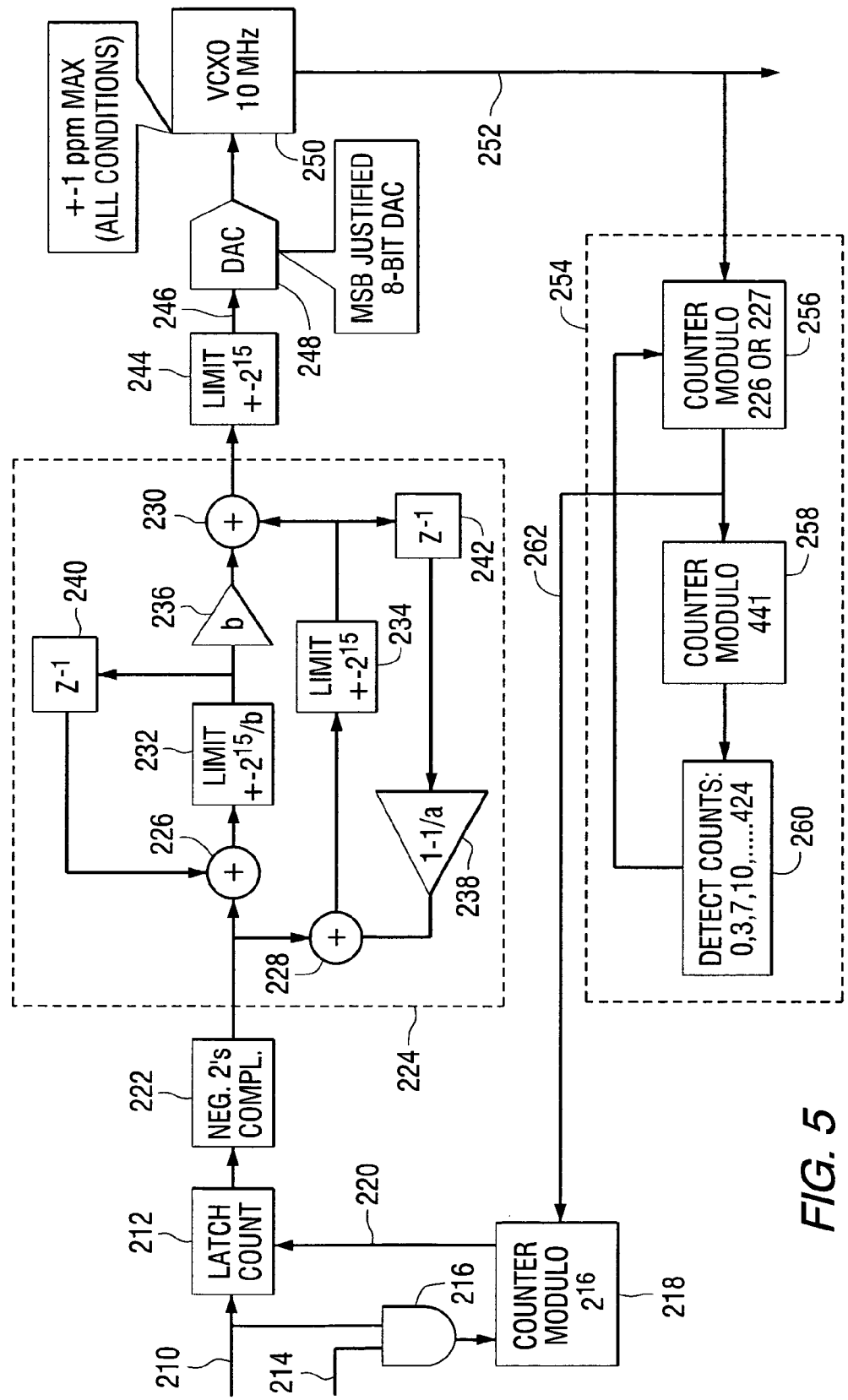
FIG. 5 is a schematic diagram of a circuit constructed in accordance with the invention.

This invention provides a method for synchronizing the exgine 10 MHz clock with the modem frame clock from the exporter. FIG. 5 is a schematic diagram of a phase-locked loop (PLL) circuit constructed in accordance with the invention. In the circuit of FIG. 5, modem frame pulses at a period of about 1.486 seconds (reciprocal=0.673 Hz) are input on line 210 to a latch circuit 212. The modem frame pulses indicate the start of the modem frame. An initial sync signal on line 214 is subjected to a logical AND operation with the modem frame pulses by gate 216 to produce a reset signal for modulo $2^{16}$ counter 218 on line 220. Various methods can be used to start the initial sync acquisition. One prototype uses a pushbutton to start the initial sync acquisition. Commercial hardware may initialize this from a computer controller where all transmission parameters are controlled from a graphical user interface (GUI), or whatever the manufacturer deems convenient. The count from counter 218 is stored in latch 212. The count is latched in response to a leading edge of a modem frame pulse.

The negative 2's complement of the latched count is performed as shown in block 222 to produce an error signal that is delivered to a loop filter 224. The 2's complement is a convenient method of representing both positive and negative timing count errors (relative to zero count error) in the counter/phase detector. This count (2's complement) provides a measurement of the relative phase or timing error between the input pulses and regenerated modem frame clock of the exgine. The PLL acts to reduce this count to zero. The resolution of the count is in 44.1 kHz clock samples, or about 23 microseconds. In conventional phase-locked loops, a binary latch-type circuit is used to create an error pulse width for each impulse that is equal to the pulse time difference of the input and divided-down feedback signal. This pulse width would normally be processed in the loop filter. Instead this invention uses a counter (instead of an analog pulse width) to indicate the timing error of each incoming modem frame pulse. This method allows a reset to the counter to ensure that the PLL is within its target phase (time) error and converges more quickly (even though it is still several hours), otherwise it may take days to converge. This counter reset allows the initial acquisition feature, which would otherwise be impossible with the conventional analog pulse width method. The otherwise extremely long acquisition time is the motivation for this counter phase detector, although the acquisition is still long (hours instead of days).

The loop filter includes summation points 226, 228 and 230, limiters 232 and 234, amplifiers 236 and 238 and feedback elements 240 and 242. The feedback elements are single-sample delay elements. The output of the loop filter is limited as shown in block 244 and the digital output of the limiter is converted to an analog control voltage on line 246 by digital to analog converter 248. A voltage controlled oscillator 250 produces a 10 MHz clock signal on line 252 in response to this control voltage.

A variable-modulus divider 254 is used to create a 44.1 kHz clock from the 10 MHz clock. The variable-modulus divider 254 includes counters 256 and 258 and detector 260, and produces a 44.1 kHz clock signal on line 262. The 44.1 kHz frequency is convenient since it is used for the audio sample rate and is an exact multiple of the modem frame rate. The variable-modulus divider effectively multiplies the 10 MHz clock frequency by a factor of 441/100000. The 44.1 kHz clock is input to a 16-bit counter, which cycles at the modem frame rate of 44100/65536, or approximately 0.673 Hz yielding a modem frame period of approximately 1.486 sec.

The counter 218 has a resolution of 16 bits. These 16 bits represent the relative phase difference between the virtual modem frame counter and the input reference modem frame timing. The count is latched on the leading edge of the input modem frame clock. This count (2's complement) provides a measurement of the relative phase or timing error between the input pulses and regenerated modem frame clock of the exgine. This phase error is subsequently processed through a loop filter and DAC to control the instantaneous frequency of the VCXO. The loop filter controls the overall performance of the PLL.

The VCXO is specified to have a nominal frequency of 10 MHz±0.5 ppm. The control voltage range should allow the VCXO frequency to reach 10 MHz±1.0 ppm. Furthermore the maximum range of VCXO frequencies shall be limited to 10 MHz±1.5 ppm under all conditions. This limitation prevents the frequency from exceeding its system worst-case tolerance of ±2 ppm.

A 16-bit DAC is assumed, although only 8 MSBs (e.g., 8-bit DAC) are needed for adequate performance. The full range of the DAC is limited to $\pm 2^{15}$, which should control the VCXO to at least a range of 10 MHz±1.0 ppm, but no greater than ±1.5 ppm to ensure compliance with the system specification. Limiting functions are applied at various points in the digital signal path to prevent numeric overflow or underflow.

The PLL of FIG. 5 produces a 10 MHz clock output on line 252 and an associated frequency divider is used to produce a virtual modem frame period of approximately 1.486 seconds. The PLL phase-locks the virtual modem frame periods to the incoming modem frame pulses, ensuring that the 10 MHz clock in the exgine is coherently related to the incoming modem frame periods in the exporter.

A special feature of the described embodiment is the use of an input counter with a reset in the input phase detector. In known phase-locked loops, a binary latch-type circuit is used to create an error pulse width for each impulse that is equal to the pulse time difference of the input and divided-down feedback signal. This pulse width would normally be processed in the loop filter. Instead this invention uses a counter with a reset to ensure that the PLL is within its target phase (time) error and converges more quickly (even though it is still several hours), otherwise it may take days to converge.

The stability, damping factor and other performance parameters of the PLL are most conveniently analyzed in steady-state operation using an ideal linear model approximation of the PLL. The linear model allows conventional servo control theory analysis techniques to determine appropriate design parameters (particularly the loop filter) to control stability and performance in operation. This model shown in FIG. 6 describes frequency in units of radians/sec, and signal values in volts.

FIG. 6 is a diagram of a linear model 270 of the PLL of FIG. 5. The model includes a phase detector 272 that receives input modem frame pulses as illustrated by line 274. The output of the phase detector on line 276 is amplified by amplifier 278 having a gain of Kd volts/radian. The amplified signal on line 280 is amplified and integrated by integrator 282, having a gain of "b", and amplified by amplifier 284, having a gain of "a". The integrated signal on line 286 is added to the amplified signal on line 288 at summation point 290. The resulting signal on line 292 is used to control a voltage controlled oscillator (phase integrator) 294 to produce an output signal on line 296 that is fed back to the phase detector. The loop filtering illustrated in FIG. 6 can be implemented in software, and a hardware voltage controlled crystal oscillator (VCXO) controlled by a digital to analog converter (DAC).

The gain values a and b within the loop filter can be determined using conventional servo control theory techniques by starting with the derived values of a and b determined in a full analysis. Then the resulting PLL performance can be characterized with these assumed values. Referring to FIG. 6, the phase detector gain Kd produces a value (voltage) related to a latched counter of 16 bits. Therefore Kd is computed as $$Kd = \frac{2^{16}}{2 \cdot \pi} = 10430 \text{ volts/radian}$$

The VCXO, including the frequency divider, produces a square wave with a period P=1.486 seconds (fo≅0.672 Hz). A DAC value change of 2 (volts) causes a frequency shift of 1 ppm. Then the VCXO gain Ko is computed as $$Ko = \frac{10^{-6} \cdot 2 \cdot \pi \cdot fo}{2^{15}} = 1.29 \cdot 10^{-10} \text{ radians/sec-volt.}$$

or $$Ko = \frac{10^{-6} \cdot 2^{-15} \cdot 2 \cdot \pi}{P}, \text{ where } fo = 1/P.$$

The two factors Kd and Ko can be conveniently expressed as one parameter K, where $K = Kd \cdot Ko = 2 \cdot 10^{-6} \cdot fo = 1.3458 \cdot 10^{-6} \text{ sec}^{-1}$.

The closed loop transfer function H(s) of the linear model of the PLL can be used to assess performance and stability. FIGS. 7a and 7b are schematic diagrams of circuits that show a conventional analog loop filter loop design which serve as starting designs to facilitate the use of conventional servo loop theory (Laplace Transforms, etc.). Then the designs can be converted to an equivalent digital version. FIG. 7a is a circuit 300 having an input 302 and an output 304. Resistors R1 connect the input to amplifiers 306 and 308. The outputs of the amplifiers are added to summation point 310. Capacitor C provides feedback for amplifier 306. Resistor R2 provides feedback for amplifier 308.

FIG. 7b is a circuit 320 having an input 322 and an output 324. The input is connected at a first amplifier 326 and a summation point 328. The summation point 328 is connected to a second amplifier 330. The outputs of the amplifiers are added at summation point 332. Impedance 334 provides feedback for summation point 328.

The time constants for the circuits illustrated in FIGS. 7a and 7b are:

$$\tau 1 = R1 \cdot C = \frac{P}{b}; \text{ and } \tau 2 = R2 \cdot C = \frac{a \cdot P}{b}.$$

The transfer function H(s) is best described using Laplace Transform techniques as $$H(s) = \frac{K \cdot F(s)}{s + K \cdot F(s)}$$

where F(s) is the embedded loop filter transfer function. An ideal second-order loop filter has a transfer function $$F(s) = -\left(\frac{1}{s \cdot C \cdot R1} + \frac{R2}{R1}\right).$$

Conventional analysis of the loop filter describes important characteristics of the PLL in terms of time constants τ1 and τ2. These time constants refer to properties of an integrator and gain components of a loop filter implemented with RC components used in an ideal second-order PLL. The relationships between these time constants and their digital equivalents are illustrated in FIGS. 7a and 7b.

The resulting transfer function for the PLL can now be rewritten as $$H(s) = \frac{K \cdot F(s)}{s + K \cdot F(s)} = \frac{K \cdot (s \cdot \tau 2 + 1)/\tau 1}{s^2 + s \cdot (K \cdot \tau 2/\tau 1) + K/\tau 1}.$$

Furthermore the transfer function can be described in servo terminology as $$H(s) = \frac{2 \cdot \zeta \cdot \omega_n \cdot s + \omega_n^2}{s^2 + 2 \cdot \zeta \cdot \omega_n \cdot s + \omega_n^2}.$$

where $\omega_n$ is the natural frequency and $\xi$ is the damping factor of the PLL, and $$\omega_n = \sqrt{\frac{K}{\tau 1}} = \sqrt{\frac{K \cdot b}{P}} \text{ and } \zeta = \frac{\tau 2 \cdot \omega_n}{2} = \frac{a \cdot P \cdot \omega_n}{2 \cdot b}.$$

The analysis, design and simulation performance of the PLL suggests a desired value of a=512, and b=0.063 (b=1/16). The PLL natural frequency can be computed as $$\omega_n = \sqrt{\frac{K \cdot b}{P}} \cong 2.38 \cdot 10^{-4} \text{ Hz}.$$

The resulting damping factor is then $$\zeta = \frac{a \cdot P \cdot \omega_n}{2 \cdot b} \cong 1.448.$$

This damping factor is set to a higher than typical value (more typically between 0.7 and 1.0) to provide additional phase margin for stability. The additional margin is needed to compensate for the delay in the additional filter implementation for the gain b path. Also, the margin ensures stability and minimizes overshoot when the implemented VCO gain Ko is slightly higher than predicted. Although the linear model approximation is useful to derive some parameters as described above, some more refinement of the design through digital simulation techniques is generally desirable.

Figure 8:
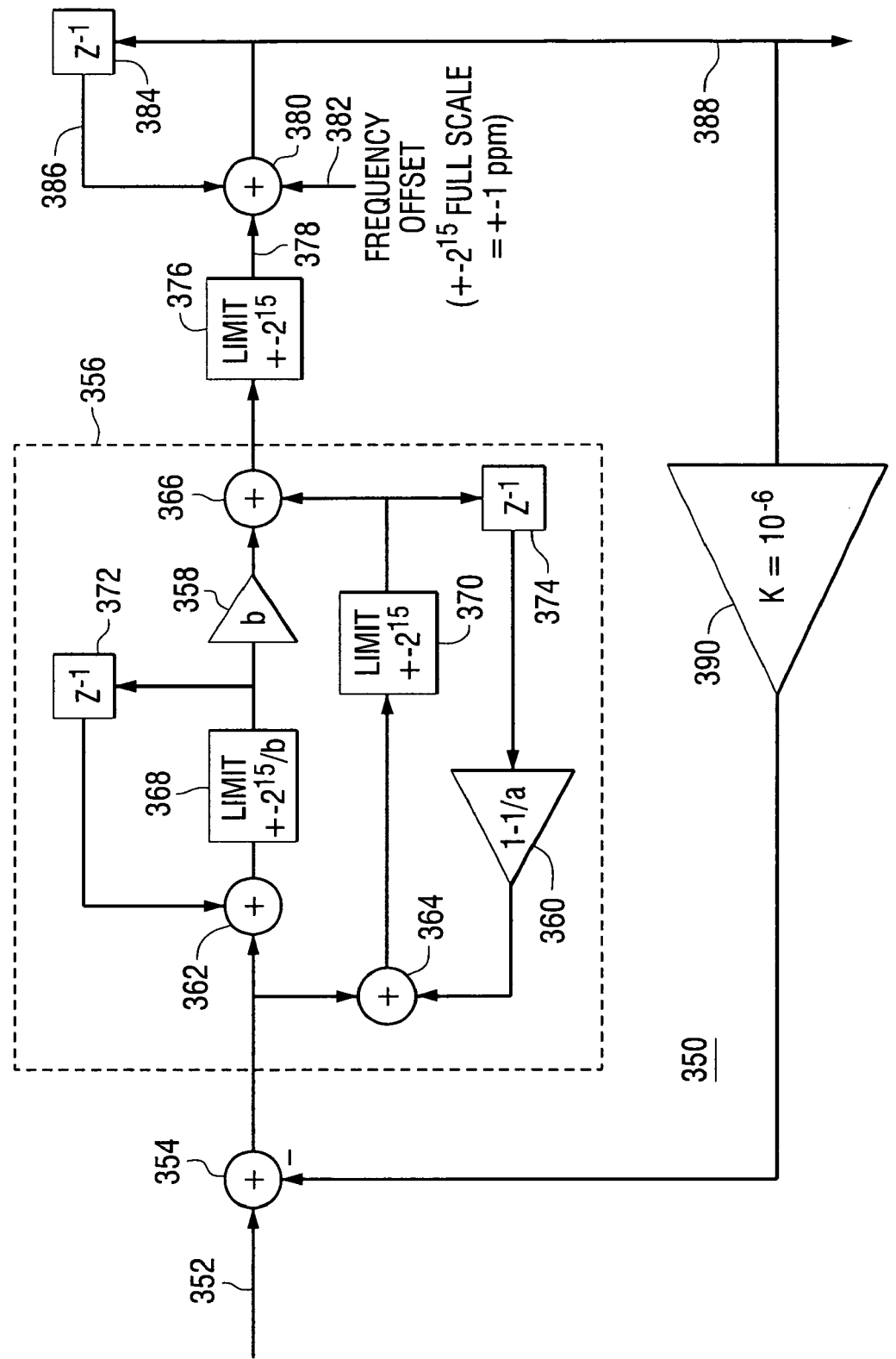
FIG. 8 is a diagram of a digital simulation model of the invention.

FIG. 8 is a diagram of a digital simulation model 350 of the invention. The model includes an input 352 connected to summation point 354. The summation point is connected to a loop filter 356 in the form of an infinite impulse response (IIR) filter comprising amplifiers 358 and 360, summation points 362, 364 and 366, limiters 368 and 370, and impedances 372 and 374. The output of the loop filter is limited by limiter 376. The resulting limited signal on line 378 is combined at summation point 380 with a frequency offset signal on line 382 and a feedback signal from digital phase integrator 384 on line 386 to produce a 10 MHz clock signal on line 388. The clock signal is fed back to summation point 354 through amplifier 390.

Performance of the PLL design can be further assessed using the digital simulation model shown in FIG. 8. The design parameters derived from the linear model are used in the digital model. Any analog components such as the VCXO are converted to their equivalent digital version (e.g., a digital phase integrator for the VCXO). The digital simulation can be used to characterize the effects of nonlinearities and details, which do not easily translate to simplified linear analysis techniques.

One refinement from the linear model to the digital simulation model is the modification of the gain b path within the loop filter. The simple gain=b was replaced with a one-pole IIR filter having a dc gain of b. This was done to smooth and limit the peaks of the noisy phase error samples. Without this filter, the noisy peaks would typically clip. This clipping would result in a bias error when the control voltage is not nominally zero, such as during acquisition. The filtering reduces the peak values and suppresses any bias during acquisition. However this filtering actually reduces the phase margin due to the additional IIR filter delay relative to the flat gain b. The damping factor was initially set higher than typical to compensate for this anticipated effect.

Figure 9:
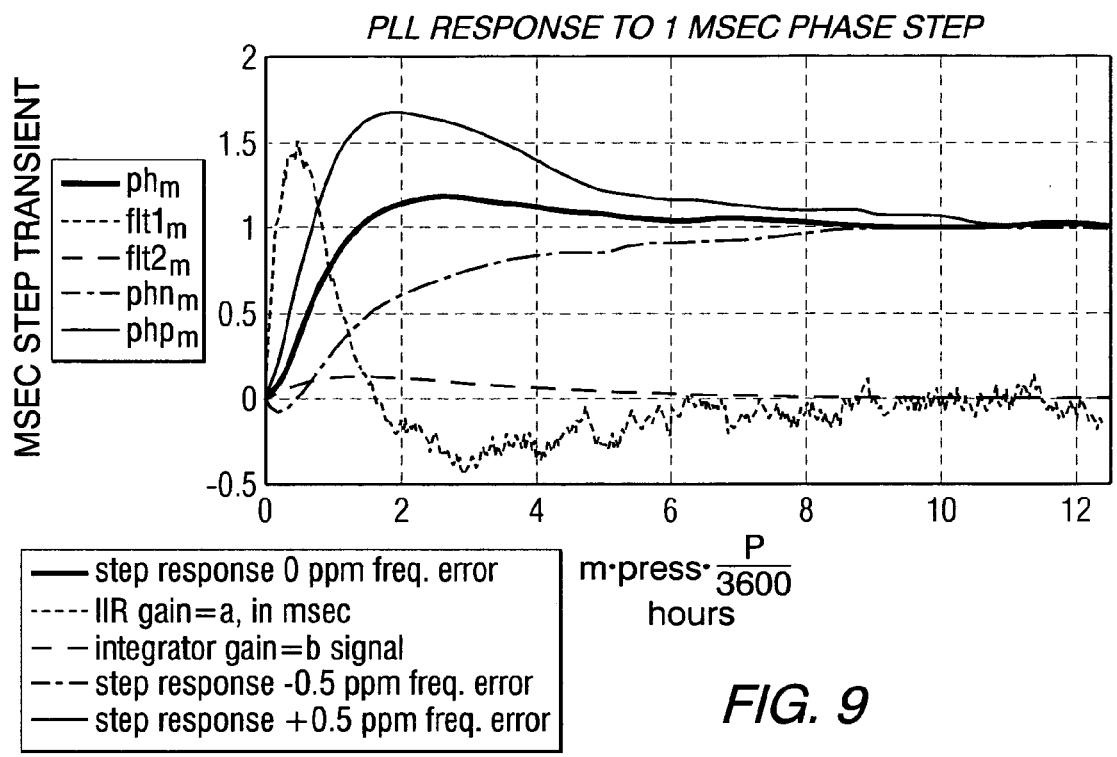
FIG. 9 is a graph of the PLL response to 1 msec initial offset and 1 msec rms input phase jitter.
Figure 10:
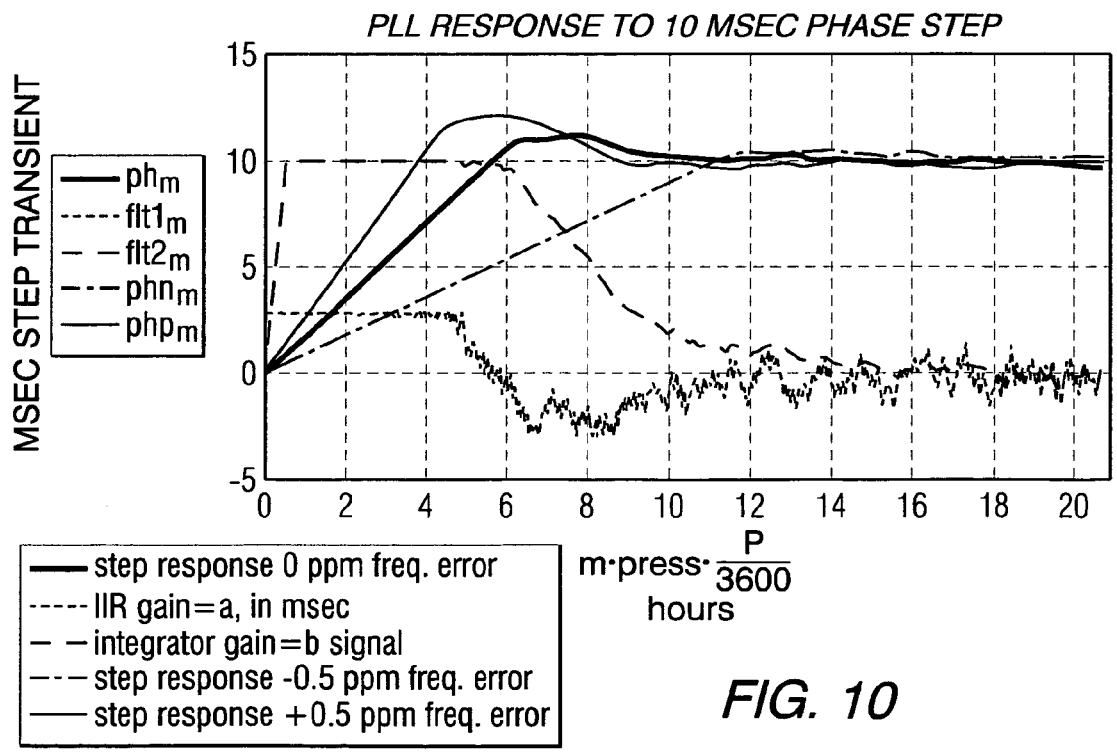
FIG. 10 is a graph of the PLL response to 10 msec initial offset and 10 msec rms input phase jitter.

The design was simulated and the results for some typical operation conditions are illustrated in FIGS. 9 and 10. FIG. 9 shows plots of various signals when the input was initialized with a step error of 1 msec, and with an rms phase jitter of 1 msec. FIG. 10 shows similar results when the initial step error and rms phase noise are both set to 10 msec.

The timing error between the incoming modem frame pulses and the regenerated PLL pulses can be evaluated through observation of the output of the IIR gain portion of the loop filter. This IIR filter has a time constant of about 512 modem frame periods, or approximately 12.7 minutes where the error samples are effectively averaged with its decaying exponential impulse response. The average value of the filter represents the average input timing error ($\pm 2^{15}$ full scale=1 period), multiplied by the gain a=512. Since the IIR filter includes a limiting function of $\pm 2^{15}$, then the output saturates at an input error value of $\pm 2^{15}/512=\pm 64$, which equates to an IIR filter output of $\pm 2^{15}$, or approximately 2.9 msec. This value can be used to determine if the initial acquisition error is too large to continue, and it would be preferable to resynchronize the system. Otherwise the value represents the short-term (12.7 minutes) average phase error. When the input phase error jitter and noise are small (less than 1 msec), the steady-state error after a long settling period (roughly 8 hours) should converge to less than 0.1 msec rms. With 10 msec of input jitter error, the resulting system phase error jitter should be less than 1 msec rms.

The PLL used in the described digital audio broadcasting systems is unusual because of the extremely high frequency multiplication factor of about 15 million (0.673 Hz to 10 MHz), along with the relatively high phase jitter on the input pulses over the STL link. The input frequency pulse is created by decoding a periodic message from the STL link.

The output of the STL link carrying periodic modem frames is converted to sync pulses at the start of each received modem frame. The PLL input signal comprises periodic messages, wherein the input pulses indicate the start of a modem frame. Since the output phase noise is computed as the input phase noise multiplied by the frequency multiplier factor (15 million), and filtered by the loop transfer function, this phase noise would be generally very large, except that the loop bandwidth is made extremely small to produce a very low output phase noise. In fact the loop bandwidth is so small that it takes several hours for the phase error to converge (as shown in FIGS. 9 and 10). This requires a high stability oscillator and some special design parameters.

The PLL parameters are picked to yield the required performance under the (unusual) conditions described (phase noise, acquisition time, multiplication factor). Using conventional servo loop terminology, the natural loop frequency should be roughly 1 hour, and the loop is overdamped with a damping factor of about 1.5 to ensure stability to accommodate VCXO volts/freq gain error margin. The resulting time constants (t1 and t2 described above) are computed as nearest convenient values as functions of the natural frequency and damping factor.

While the invention has been described in terms of several embodiments, it will be apparent to those skilled in the art that various changes can be made to the disclosed embodiments without departing from the scope of the invention as set forth in the following claims.

What is claimed is:

1. A method for synchronizing an exciter clock with a modem frame clock in a broadcasting system, the method comprising the steps of:

using a first input to receive a plurality of modem frame pulses that are representative of the start of modem frames, wherein timing of the modem frame pulses is controlled by a modem frame clock;

using a clock to produce an exciter clock signal;

using a counter to count pulses representative of the exciter clock signal to produce a count representative of timing error of each incoming modem frame pulse;

using a loop filter to control the exciter clock signal in response to the count; and using a second input to reset the count in response to a combination of a sync signal and the modem frame pulses.

2. The method of claim 1, further comprising the step of:
   using a latch to latch the count in response to the modem frame pulses.

3. The method of claim 1, further comprising the step of: using a processor to take the 2's complement of the count.

4. The method of claim 1, wherein pulses representative of the exciter clock signal are produced using a variable-modulus divider.

5. The method of claim 1, wherein the frequency of the modem frame pulses is about 0.673 Hz, and the frequency of the exciter clock is about 10 MHz.

6. An apparatus for synchronizing an exciter clock with a modem frame clock in a broadcasting system, the apparatus comprising:
   an input for receiving a plurality of modem frame pulses that are representative of the start of modem frames, wherein timing of the modem frame pulses is controlled by a modem frame clock;
   a voltage controlled oscillator for producing an exciter clock signal;
   a counter for counting pulses representative of the exciter clock signal to produce a count representative of timing error of each incoming modem frame pulse;
   a loop filer for controlling the exciter clock signal in response to the count; and
   an input for resetting the count in response to a combination of a sync signal and the modem frame pulses.

7. The apparatus of claim 6, further comprising:
   a latch for latching the count in response to the modem frame pulses.

8. The apparatus of claim 6, further comprising:
   a circuit for taking the 2's complement of the count.

9. The apparatus of claim 6, further comprising:
   a variable-modulus divider for producing pulses representative of the exciter clock signal.

10. The apparatus of claim 6, wherein the frequency of the modem frame pulses is about 0.673 Hz, and the frequency of the exciter clock is about 10 MHz.

11. An apparatus for synchronizing an exciter clock with a modem frame clock in a broadcasting system, the apparatus comprising:
    means for receiving a plurality of modem frame pulses that are representative of the start of modem frames, wherein timing of the modem frame pulses is controlled by a modem frame clock;
    means for producing an exciter clock signal;
    means for counting pulses representative of the exciter clock signal to produce a count representative of timing error of each incoming modem frame pulse;
    means for controlling the exciter clock signal in response to the count; and
    means for resetting the count in response to a combination of a sync signal and the modem frame pulses.

12. The apparatus of claim 11, further comprising:
    means for latching the count in response to the modem frame pulses.

13. The apparatus of claim 11, further comprising:
    means for taking the 2's complement of the count.

14. The apparatus of claim 11, further comprising:
    means for producing pulses representative of the exciter clock signal.

15. The apparatus of claim 11, wherein the frequency of the modem frame pulses is about 0.673 Hz, and the frequency of the exciter clock is about 10 MHz.

* * * * *